United States Patent [19]
Davies et al.

[11] Patent Number: 6,153,905
[45] Date of Patent: Nov. 28, 2000

[54] SEMICONDUCTOR COMPONENT INCLUDING MOSFET WITH ASYMMETRIC GATE ELECTRODE WHERE THE DRAIN ELECTRODE OVER PORTIONS OF THE LIGHTLY DOPED DIFFUSION REGION WITHOUT A GATE DIELECTRIC

[75] Inventors: Robert B. Davies, Tempe; Andreas A. Wild, Scottsdale, both of Ariz.

[73] Assignee: Motorola, Inc., Schaumburg, Ill.

[21] Appl. No.: 09/502,694

[22] Filed: Feb. 11, 2000

Related U.S. Application Data

[62] Division of application No. 09/216,990, Dec. 21, 1998, Pat. No. 6,051,456.

[51] Int. Cl.[7] .................................................. H01L 29/788
[52] U.S. Cl. ...................... 257/320; 257/316; 257/317; 438/257
[58] Field of Search .................................. 257/314–320; 438/257, 258, 264, 266

[56] References Cited

U.S. PATENT DOCUMENTS

| | | | |
|---|---|---|---|
| 5,306,652 | 4/1994 | Kwon et al. | 438/283 |
| 5,346,835 | 9/1994 | Malhi et al. | 438/200 |
| 5,402,374 | 3/1995 | Tsuruta et al. | 365/185 |
| 5,406,110 | 4/1995 | Kwon et al. | 257/335 |
| 5,578,514 | 11/1996 | Kwon et al. | 438/286 |
| 5,661,048 | 8/1997 | Davies et al. | 438/217 |
| 5,714,393 | 2/1998 | Wild et al. | 438/304 |
| 5,716,866 | 2/1998 | Dow et al. | 438/286 |
| 5,736,766 | 4/1998 | Efland et al. | 257/338 |
| 5,940,706 | 8/1999 | Sung et al. | 438/261 |

FOREIGN PATENT DOCUMENTS

| | | |
|---|---|---|
| 0714128 | 5/1996 | European Pat. Off. . |
| 0837509 | 4/1998 | European Pat. Off. . |
| 0880183 | 11/1998 | European Pat. Off. . |
| 290297 | 10/1983 | German Dem. Rep. . |
| 4238749 | 5/1994 | Germany . |

OTHER PUBLICATIONS

T. Efland et al., "Lateral Thinking About Power Devices (LDMOS)", IEDM –1998, Session 26, Paper No. 1, pp. 679–682.

C. Tsai et al., "Split Gate MOSFETs in BiCMOS Power Technology for Logic Level Gate Voltage Application", 1999 IEEE–ISPSD Conference, May 26–28, 1999 (Toronto, Canada), pp. 85–88.

*Primary Examiner*—Charles Bowers
*Assistant Examiner*—William M. Brewster
*Attorney, Agent, or Firm*—A. Kate Huffman

[57] ABSTRACT

A semiconductor component includes an asymmetric transistor having two lightly doped drain regions (1300, 1701), a channel region (1702), a source region (1916) located within the channel region (1702), a drain region located outside the channel region (1702), a dielectric structure (1404) located over at least one of the two lightly doped drain regions (1300, 1701), two gate electrodes (1902, 1903) located at opposite sides of the dielectric structure (1404), a drain electrode (1901) overlying the drain region (1915), and a source electrode (1904) overlying the source region (1916). The semiconductor component also includes another transistor having an emitter electrode (122) located between a base electrode (121) and a collector electrode (123) where the base electrode (121) is formed over a dielectric structure (1405).

1 Claim, 14 Drawing Sheets

SEMICONDUCTOR COMPONENT INCLUDING MOSFET WITH ASYMMETRIC GATE ELECTRODE WHERE THE DRAIN ELECTRODE OVER PORTIONS OF THE LIGHTLY DOPED DIFFUSION REGION WITHOUT A GATE DIELECTRIC

This application is a Divisional of prior U.S. application Ser. No. 09/216,990, filed on Dec. 21, 1998 now U.S. Pat. No. 6,051,456.

BACKGROUND OF THE INVENTION

This invention relates, in general, to electronics, and more particularly, to semiconductor components and methods of manufacture.

The size of metal-oxide-semiconductor field effect transistors (MOSFETs) is continually being reduced. However, this reduction in size degrades many output characteristics of the MOSFETs. For example, MOSFETs with submicron dimensions have lower breakdown voltage and decreased output impedance because of modulation of the channel length due to the drain-induced barrier lowering. These disadvantages severely limit the use of the smaller MOSFETs in analog applications.

Accordingly, a need exists for a semiconductor component having transistors with sufficiently high breakdown voltage, output impedance, and frequency response. A need also exists for a method of manufacturing the semiconductor component that does not substantially increase the complexity or cost of a standard CMOS process. A further need exists for manufacturing bipolar transistors simultaneously with the CMOS devices to increase the functionality of the semiconductor component.

BRIEF DESCRIPTION OF THE DRAWINGS

For simplicity and clarity of illustration, elements in the drawings are not necessarily drawn to scale, and the same reference numerals in different figures denote the same elements.

DETAILED DESCRIPTION OF THE DRAWINGS

Figure 1:
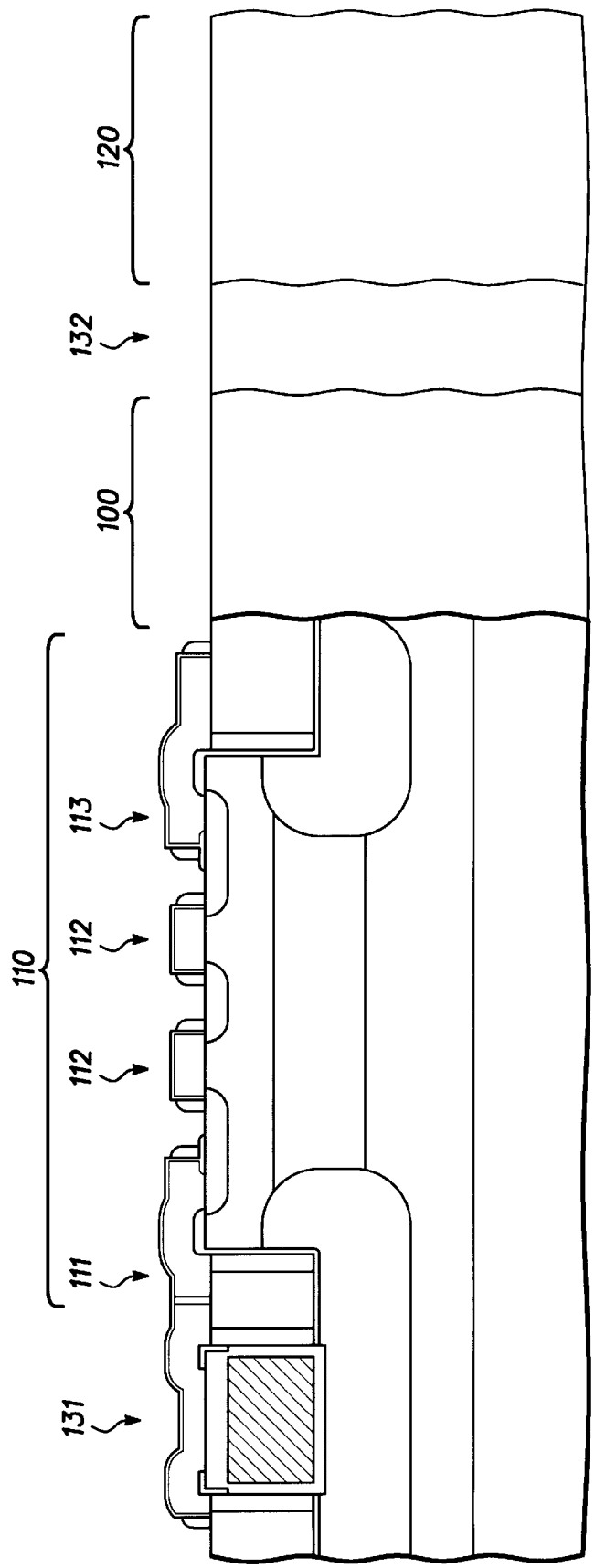
FIG. 1 illustrates an embodiment of a cross-sectional view of a portion of a semiconductor component in accordance with the present invention.

FIG. 1 illustrates a cross-sectional view of a portion of a semiconductor component 130. Component 130 includes, among other features, a power distribution structure 131 formed in or over two semiconductor epitaxial layers 301 and 302 and a support substrate or semiconductor substrate 300. Structure 131 represents a Vdd contact. Component 130 additionally includes a p-channel, metal-oxide-semiconductor field effect transistor (MOSFET) 110. Transistor 110 has at least one gate terminal or electrode 112 located between a drain terminal or electrode 113 and a source terminal or electrode 111. Portions of component 130 that include transistors similar to transistor 110 are preferably used to provide standard, low voltage digital functions.

Figure 2:
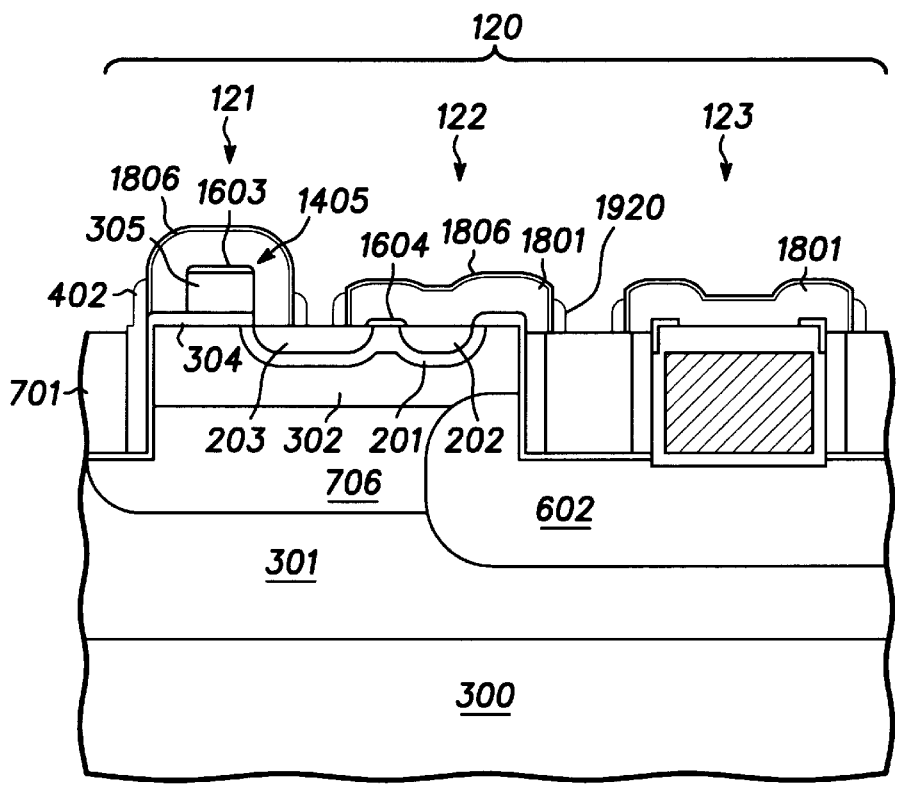
FIG. 2 illustrates an embodiment of a more detailed cross-sectional view of a first part of the portion of the semiconductor component delineated by a dashed square 2 in FIG. 1 in accordance with the present invention.

FIG. 2 illustrates a more detailed cross-sectional view of a first part of component 130 delineated by a dashed square 2 in FIG. 1. In particular, FIG. 2 illustrates a NPN bipolar transistor 120. Transistor 120 has an elevated emitter terminal or electrode 122 located between an elevated base terminal or electrode 121 and an elevated collector terminal or electrode 123. Portions of semiconductor component 130 that include transistors similar to transistor 120 are preferably used in circuits that are sensitive to 1/f noise.

Figure 17:
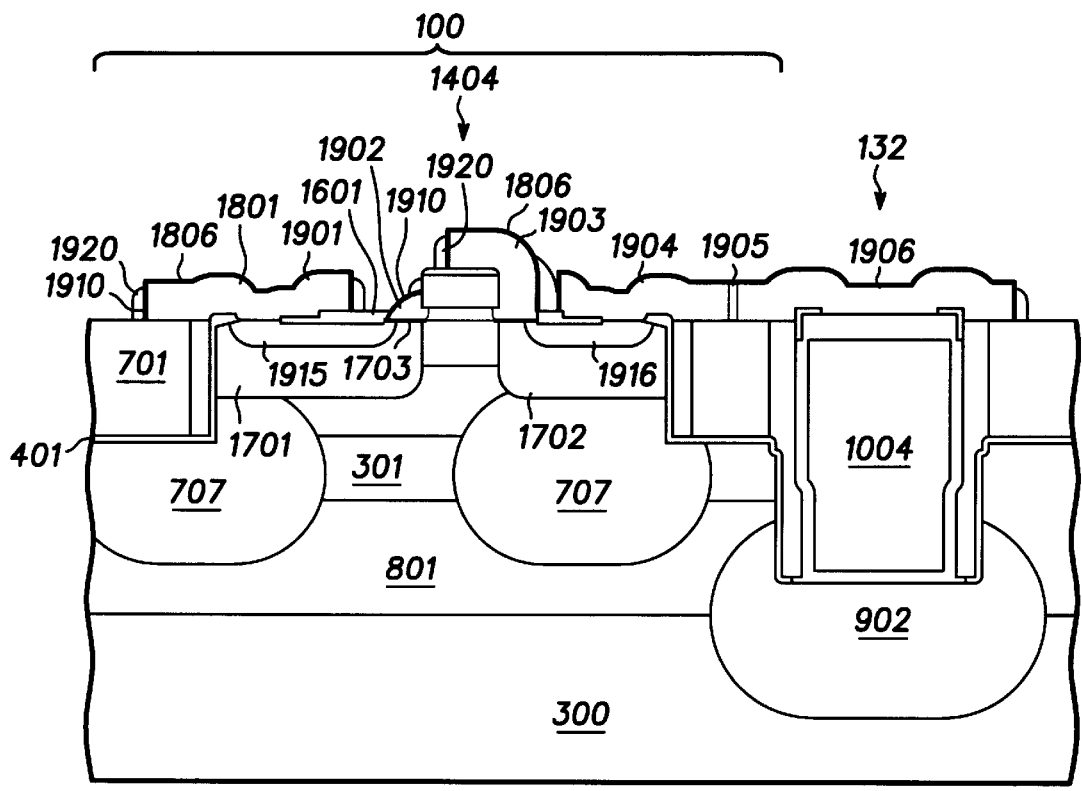

FIG. 17 illustrates a more detailed cross-sectional view of a second part of component 130 delineated by a dashed square 19 in FIG. 1. In particular, FIG. 17 illustrates component 130 to include, among other features, a power distribution structure 132, which represents a Vss contact. Component 130 additionally includes a n-channel, step channel metal-oxide-semiconductor (SCMOS) field effect transistor 100. Portions of component 130 that include SCMOS transistors similar to transistor 100 are preferably used to provide high frequency analog and digital capabilities. Transistor 100 also has a high breakdown voltage for use in power management applications. As depicted in FIGS. 1, 2, and 17, transistor 100 is located between transistors 110 and 120. Component 130 further includes electrical isolation structures between each of transistors 100, 110, and 120. For example, oxide layer 701 (FIGS. 1 and 17) is located between transistors 100 and 110 to provide electrical isolation from each other.

As illustrated in FIG. 17, transistor 100 has two elevated gate terminals or electrodes 1902 and 1903 located between an elevated drain terminal or electrode 1901 and an elevated source terminal or electrode 1903. A dielectric structure 1404 physically separates gate electrodes 1902 and 1903 from each other, and gate electrode 1903 does not overlie electrode 1902. Gate electrode 1903 is electrically biased to a variable voltage source to control the underlying channel region of transistor 100. Gate electrode 1902 is not electrically biased to a voltage potential and remains electrically floating. However, electrode 1902 may be capacitively coupled to drain electrode 1901. Electrode 1902 exists as a by-product or artifact of the manufacturing process for transistor 100. In operation of component 130, gate electrodes 1902 and 1903 do not substantially electrically bias or otherwise affect each other.

Transistor 100 also includes a lightly doped drain region 1300 in layer 302. Transistor 100 can also include an optional lightly doped drain region 1701. A portion of region 1701 is located at least partially within or overlaps a portion of region 1300. Region 1701 has a higher doping concentration than region 1300 in order to lower the electrical resistance as electrons move from a channel region 1702 to drain electrode 1901. Channel region 1702 of transistor 100 is located at least partially within or overlaps region 1300.

A portion of region 1300 physically separates lightly doped drain region 1701 from channel region 1702. A source region 1916 of transistor 100 is located under or underlies source electrode 1904 and is preferably located or contained completely within or is preferably overlapped entirely by regions 1300 and 1702. A drain region 1915 of transistor 100 is located under or underlies drain electrode 1901 and is preferably located or contained completely within or is preferably overlapped entirely by regions 1300 and 1701. Unlike source region 1916, drain region 1915 is preferably located completely outside of channel region 1702. Transistor 100 does not have a lightly doped source region, which in conjunction with gate electrodes 1902 and 1903 provides an asymmetric configuration for transistor 100.

Semiconductor component 130 can include a plurality of transistors, such as transistors 100, 110, and 120 in FIGS. 1, 2, and 17, that are arranged and electrically coupled together to perform a desired function. While transistors 100, 110, and 120 are illustrated to have a specific conductivity type such a n-channel or p-channel device or a NPN bipolar device, semiconductor component 130 can also include other transistors similar to transistors 100, 110, and 120 that have the opposite conductivity type such as, for example, a PNP bipolar device. Therefore, semiconductor component 130 can be a bipolar complementary metal-oxide-semiconductor (BiCMOS) integrated circuit.

Figure 3:
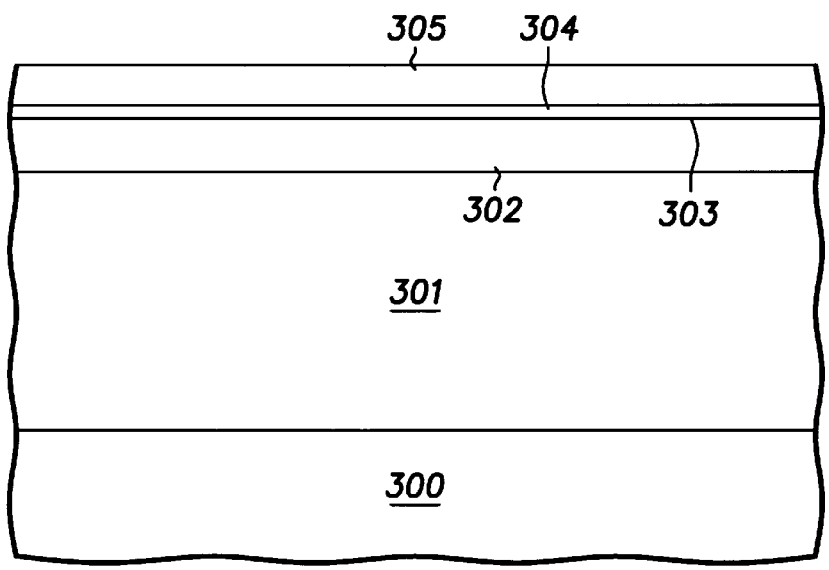
FIGS. 3–9 illustrate an embodiment of the portion of the semiconductor component during a preliminary manufacturing process in accordance with the present invention.

FIGS. 3–9 illustrate semiconductor component 130 during a preliminary manufacturing process. In FIG. 3, substrate 300 is preferably comprised of a semiconductor material such as monocrystalline silicon that is doped with a dopant of a first conductivity type to a doping concentration of approximately $1-10 \times 10^{18}$ atoms per $cm^3$. As an example, the first conductivity type can be n-type or p-type. For ease of illustration only, the first conductivity type in FIGS. 1–17 is p-type conductivity. The p-type conductivity can be provided by using, as an example, boron ions.

Epitaxial layers 301 and 302 are sequentially grown over substrate 300. In the preferred embodiment, layers 301 and 302 are comprised of the same semiconductor material as used in substrate 300. Layer 301 can be approximately 2–5 micrometers thick and can have a dopant of the first conductivity type with a doping concentration of approximately $1-10 \times 10^{15}$ atoms per $cm^3$. Layer 302 has a top surface 303 and can be approximately 0.5–1.0 micrometers thick and can have a dopant of a second conductivity type with a doping concentration of approximately $1-10 \times 10^{15}$ atoms per $cm^3$. For ease of illustration only, the second conductivity type in FIGS. 1–17 is n-type conductivity. The n-type conductivity can be provided by using, as an example, phosphorous, antimony, or arsenic ions. Substrate 300 and layers 301 and 302 can be collectively referred to as a semiconductor substrate.

An oxide layer 304 is formed over surface 303 of layer 302. As used herein, the term oxide layer is a dielectric layer comprised of silicon dioxide. For example, an oxide layer can consist substantially of silicon dioxide that is thermally grown in an oxidation furnace or that is deposited by a chemical vapor deposition process. As another example, an oxide layer can consist substantially of tetra-ethyl-ortho-silicate (TEOS) or phosphosilicate glass that is deposited by a chemical vapor deposition process. In the preferred embodiment, surface 303 of layer 302 is thermally oxidized to grow layer 304 to a thickness of approximately 10–30 nanometers.

Then, a nitride layer 305 is formed over oxide layer 304. As used herein, the term nitride layer is a dielectric layer comprised of silicon nitride. For example, a nitride layer can consist substantially of silicon nitride that is deposited by a chemical vapor deposition process. As another example, a nitride layer can consist substantially of silicon oxy-nitride that is also deposited by a chemical vapor deposition process.

Figure 4:
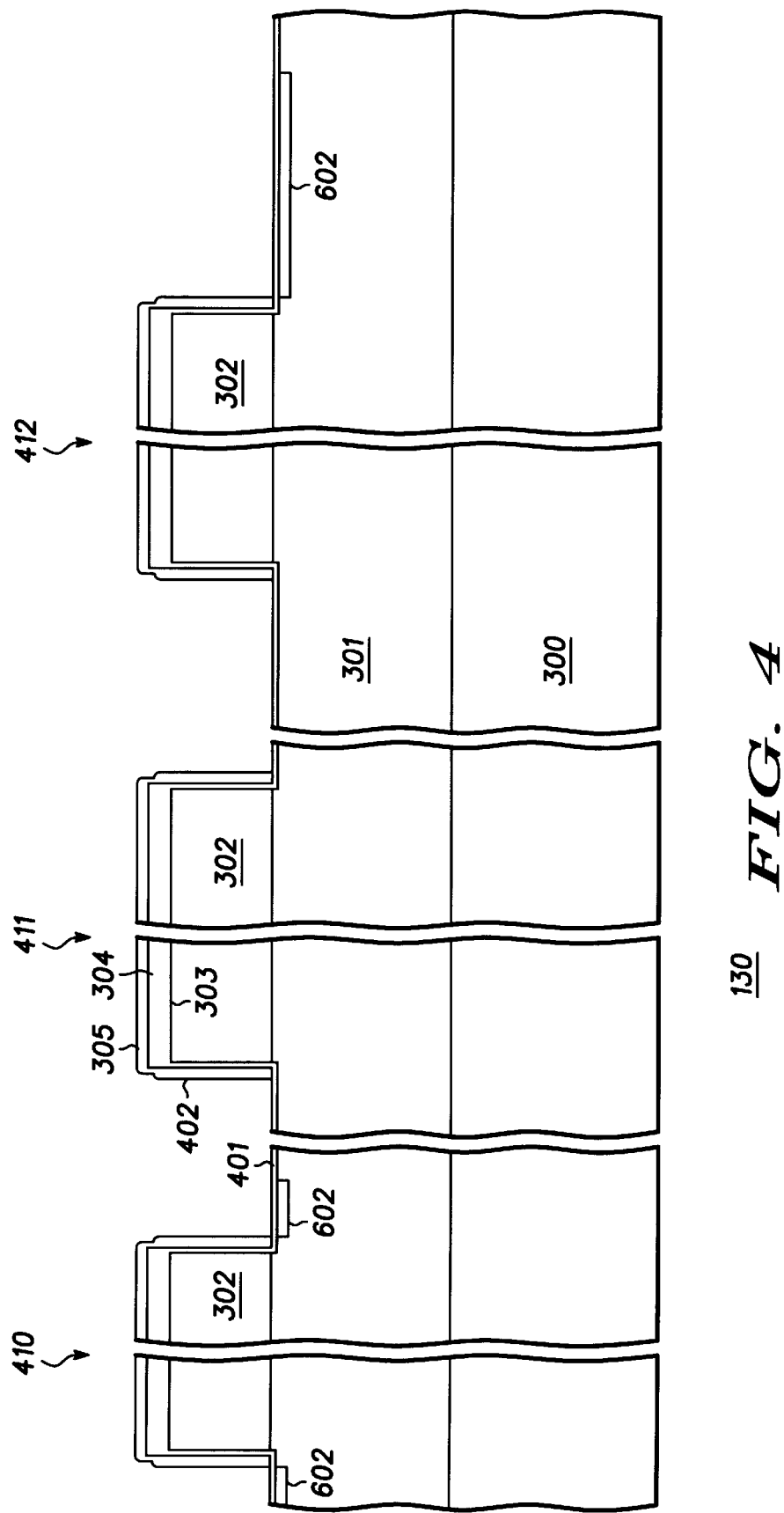

Continuing with FIG. 4, an etch mask (not shown) is formed over layer 305, and then layers 305, 304, and 302 are etched to form pedestal or mesa structures 410, 411, and 412. The etch mask is preferably comprised of photoresist. Also in the preferred embodiment, each of structures 410, 411, and 412 are approximately 2 micrometers wide; structures 410 and 411 and structures 411 and 412 are separated from each other by distance of a approximately 2 micrometers; and a 25–100 nanometer thick portion of layer 302 remains over all of layer 301. The portions of layer 302 in structures 410, 411, and 412 are subsequently used to form transistors 110, 100, and 120, respectively, in FIGS. 1 and 2.

Then, an oxide layer 401 is formed over the exposed portions of layer 302, including the sidewalls of structures 410, 411, and 412. Layer 401 is preferably formed by a thermal oxidation process that can consume all of the thin 50 nanometer thick portion of layer 302 and that may also consume a portion of layer 301. This oxidation process grows layer 401 to a thickness of approximately 50–100 nanometers. This oxidation process also rounds or smoothes out the corners of layer 302 in structures 410, 411, and 412 to reduce the electric fields in component 130.

Next, a nitride layer 402 is formed over layers 301 and 401 and over structures 410, 411, and 412. Nitride layer 402 increases the thickness of nitride layer 305 on top of structures 410, 411, and 412. Layer 402 preferably has a thickness of approximately 50–150 nanometers.

Then, a photoresist implant mask is applied and a doped region 602 of the second conductivity type is implanted through the exposed portions of oxide layer 401 and into portions of layer 302 that are not covered by the photoresist implant mask or structures 410, 411, or 412. Region 602 is also referred to as a buried layer and preferably has a doping concentration on the order of approximately $10^{18}-10^{20}$ atoms per $cm^3$. Nitride layer 305 serves as an implant mask for semiconductor epitaxial layer 302 in structures 410, 411, and 412, and spacers 500 serve as an implant mask for layer 301.

Figure 5:
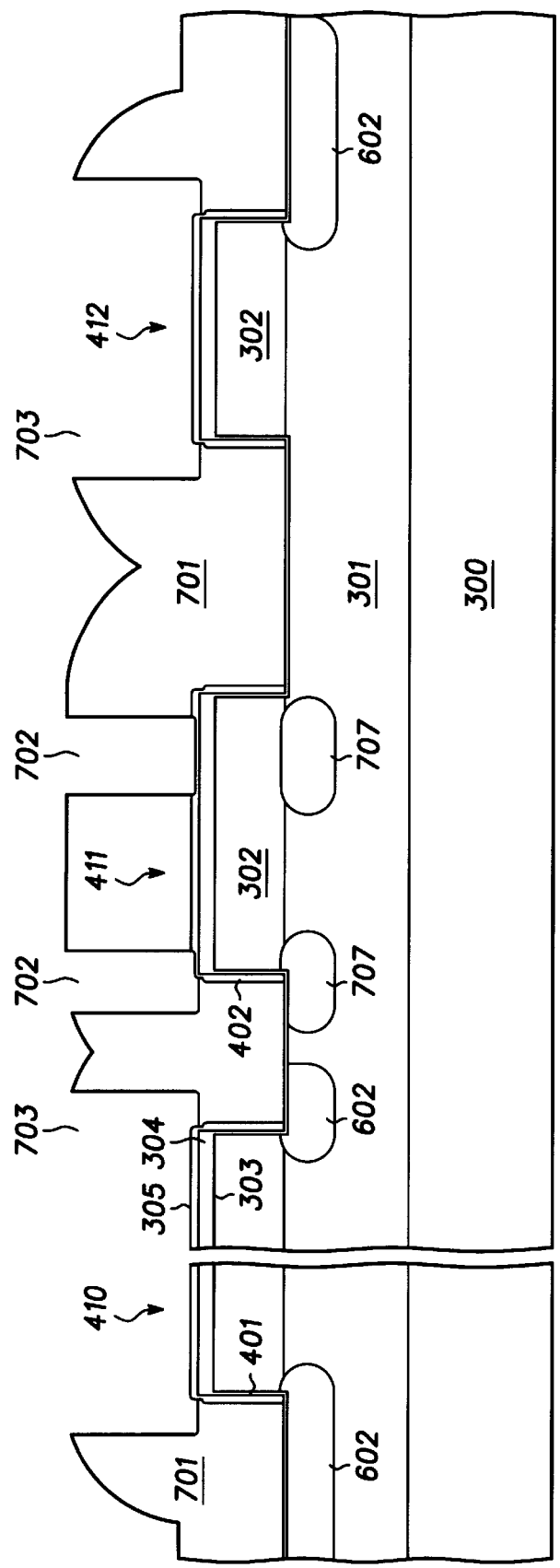

Continuing with FIG. 5, layer 305 is anisotropically etched, and an oxide layer 701 is formed over layers 305, 401, and 402 to a thickness of approximately 800–1500 nanometers. To reduce the amount of time required to deposit oxide layer 701, TEOS is preferably used for layer 701. The formation of layer 701 will drive or diffuse doped regions 602 into layer 301, as depicted in FIG. 5.

Holes 702 are formed into oxide layer 701 using an etch mask of photoresist, and doped regions 707 of the first conductivity type are implanted into layers 301 and 302 of structure 411. Oxide layer 701 serves as the implant mask. Then, a different etch mask is used to define holes 703 into layer 701 to assist the subsequent planarization of layer 701.

Figure 6:
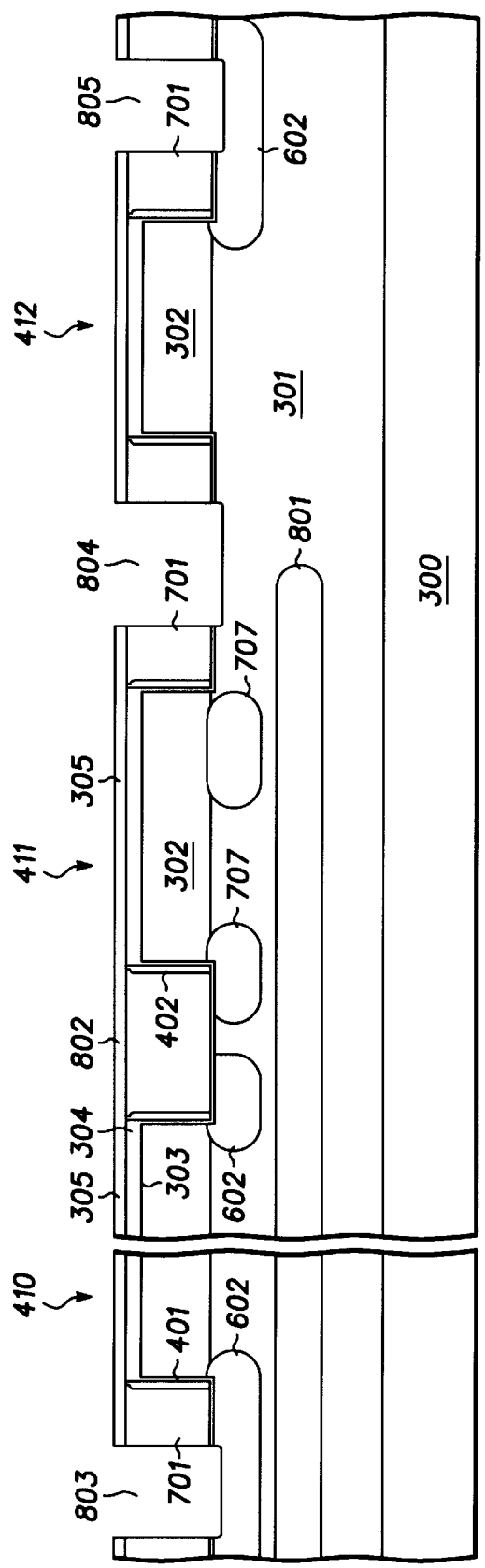

Turning to FIG. 6, layer 701 is planarized to the approximate level or height of nitride layer 305 over structures 410, 411, and 412. As an example, a chemical-mechanical polish (CMP) process can be used. An implant mask comprised of, for example, photoresist, is located over layer 701 while a doped region 801 of the first conductivity type is implanted into layer 301. As an example, a dose of approximately $2 \times 10^{13}$ atoms/$cm^2$ of boron ions can be implanted at an implant energy of approximately 500–1000 kiloelectron-Volts (keV) to form region 801.

Next, a nitride layer 802 is formed over oxide layer 701 to an approximate thickness of 100–200 nanometers. The deposition of nitride layer 802 increases the thickness of nitride layer 305 to approximately 200–300 nanometers. An etch mask is formed over layers 305 and 802 to define holes 803, 804, and 805 in layer 802. The etch mask is removed, and holes 803, 804, and 805 are extended through oxide layers 701 and 401 and into epitaxial layer 301 while the remaining portions of nitride layers 305 and 802 serve as a hard mask.

Figure 7:
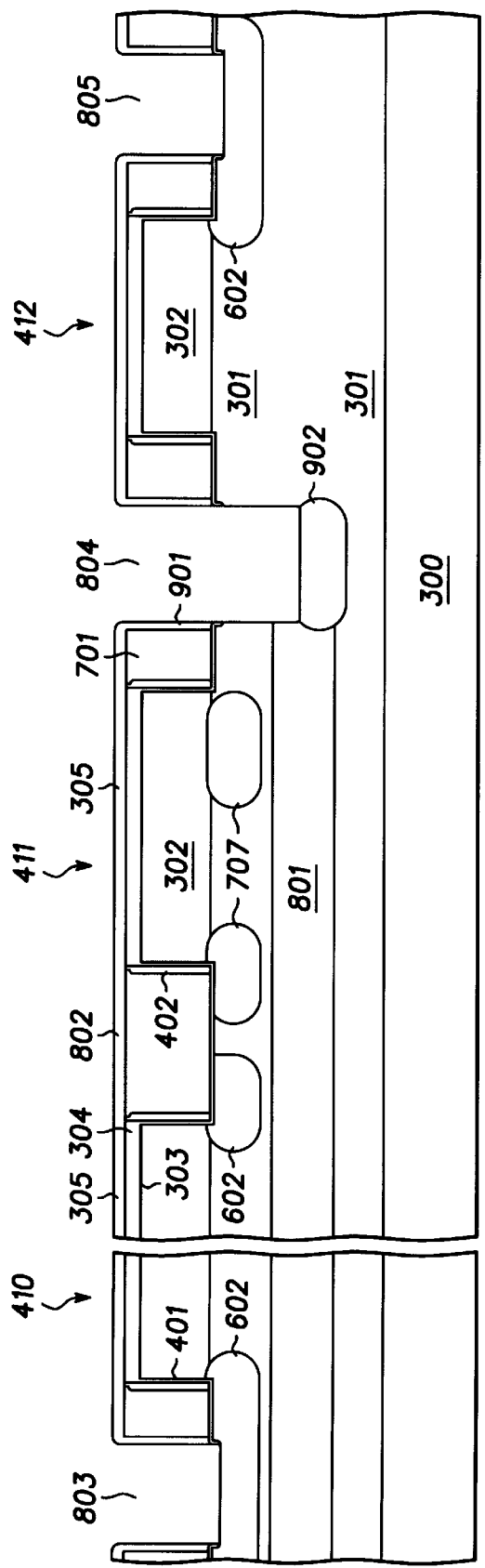

The exposed portions of layer 301 are oxidized to form a thin oxide layer, and then a nitride layer 901 (FIG. 7) is deposited over nitride layers 305 and 802 and on the sidewalls of holes 803, 804, and 805 to a thickness of approximately 25–75 nanometers. Next, nitride layer 901 is anisotropically etched to remove the portion of layer 802 at the bottom of hole 804. Portions of nitride layer 901 along the sidewalls of holes 803, 804, and 805 remain after the anisotropic etching step. Then, an etch mask is used while hole 804 is extended deeper into layer 302 to at least the depth of doped region 801, and a doped region 902 of the first conductivity type in FIG. 7 is implanted into layer 302 through hole 804 to lower the contact resistance of the subsequently formed Vss contact in hole 804.

Figure 8:
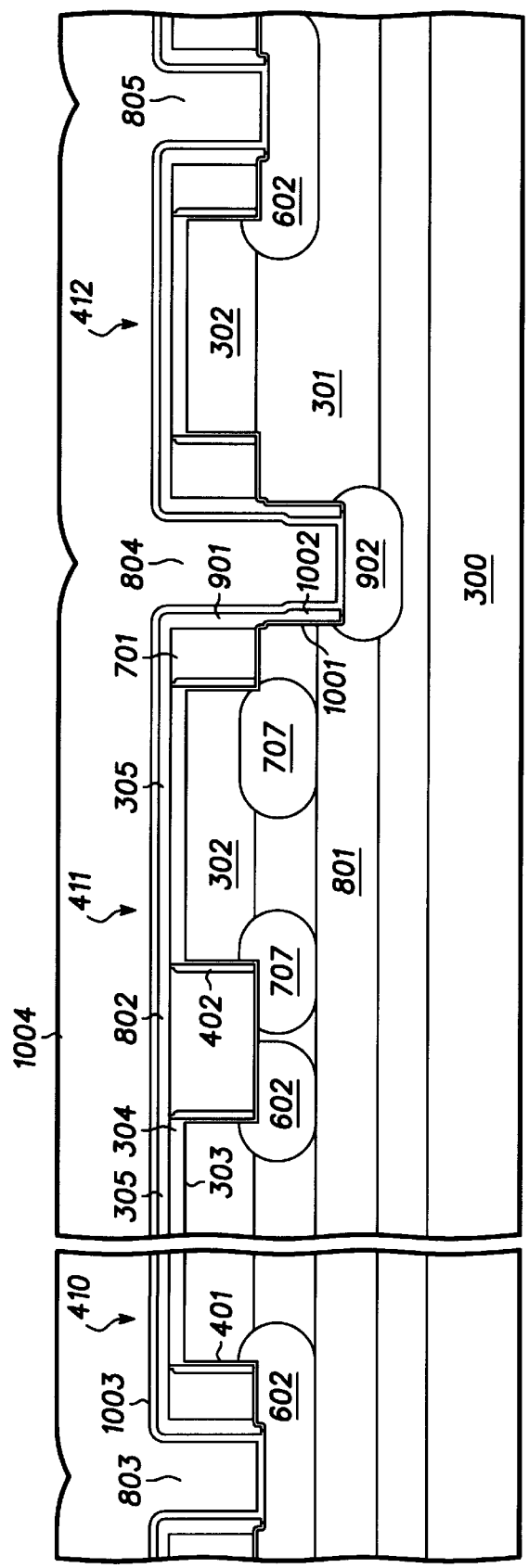

The exposed surfaces of layer 301 in hole 804 are oxidized to form an oxide layer 1001 (FIG. 8) having a thickness of approximately 25–75 nanometers, and a nitride layer 1002 (FIG. 8) is deposited over oxide layer 1001 and nitride layers 305, 802, and 901 to a thickness of approximately 50–100 nanometers. The oxide and nitride layers in hole 804 electrically insulate the semiconductor sidewalls of hole 804. Next, the portions of oxide layer 1001 and nitride layer 1002 at the bottom of holes 803, 804, and 805 are removed using an anisotropic etchant, and then a semiconductor layer 1003 in FIG. 8 is formed over nitride layers 305, 802, and 1002 and conformal to holes 803, 804, and 805 to be in physical contact with epitaxial layer 301. Layer 1003 is preferably comprised of amorphous silicon or polycrystalline silicon (polysilicon). Holes 803, 804, and 805 are subsequently filled with an electrically conductive layer 1004. In the preferred embodiment where layer 1004 is comprised of tungsten, semiconductor layer 1003 serves as an anti-oxidant for layer 1004 to improve the reliability of semiconductor component 130. In this embodiment, layer 1004 is used to form a tungsten plug.

Figure 9:
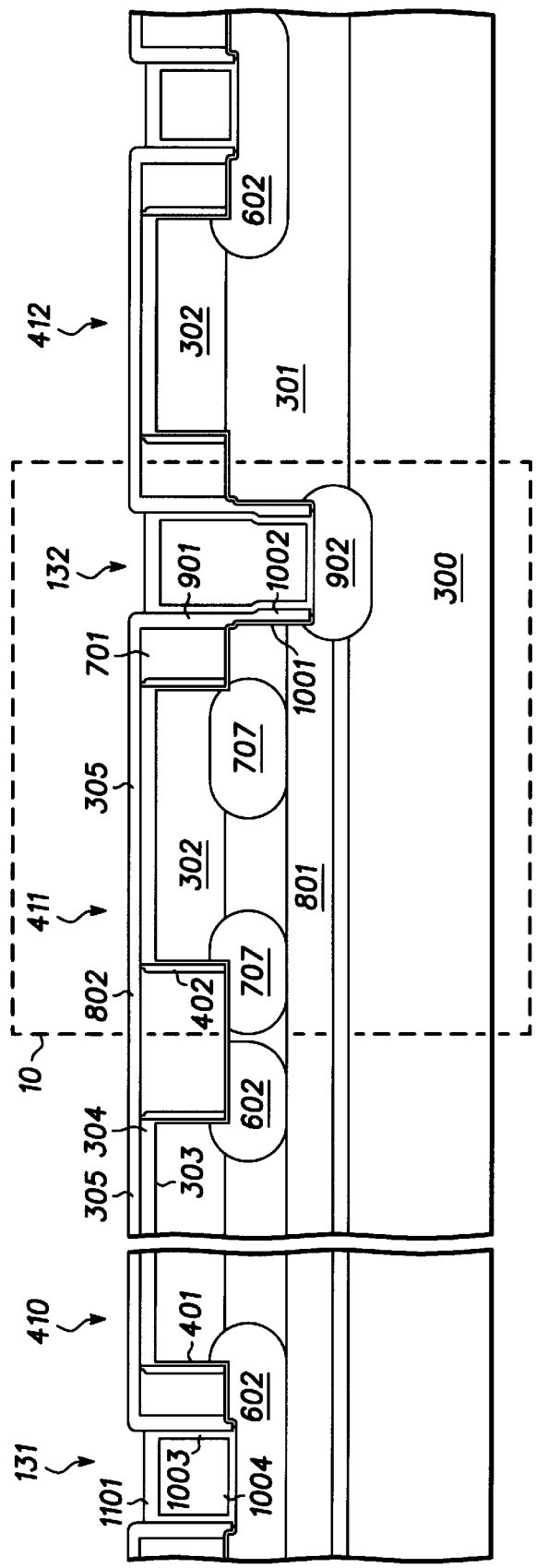

In FIG. 9, electrically conductive layer 1004 is planarized using, for example, a CMP process, and then a semiconductor layer 1101 is deposited and then patterned to be located only over layer 1004. In the preferred embodiment, layer 1101 is comprised of polysilicon such that layer 1004 is Completely encapsulated or surrounded by a layer of polysilicon to prevent tungsten oxidation. The portions of layer 1003 located underneath layer 1004 and in physical contact with epitaxial layer 302 become doped by diffusion from the adjacent or contiguous doped regions, such as regions 602 or 902.

Figure 10:
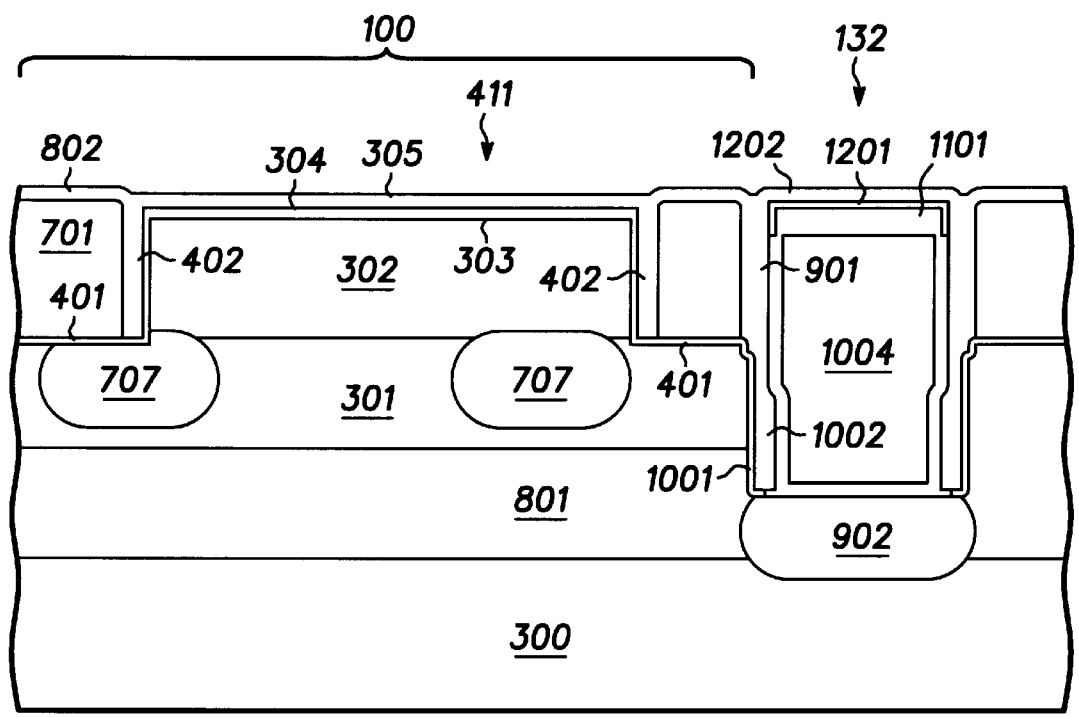
FIGS. 10–17 illustrate an embodiment of a second part of the portion of the semiconductor component during subsequent manufacturing steps in accordance with the present invention.

The remaining drawings, FIGS. 10–17, focus on the manufacturing process for transistor 100 during manufacturing method 200 (FIG. 2), which occurs after the manufacturing steps of FIGS. 3–9. FIG. 10 is denoted by a dashed square 10 in FIG. 9. In FIG. 10, the top surface of layer 1101 is oxidized to form a thin oxide layer 1201, and then a thin nitride layer 1202 is deposited to cover the thin oxide layer. Nitride layer 1202 increases the thickness of nitride layers 305 and 802.

Figure 11:
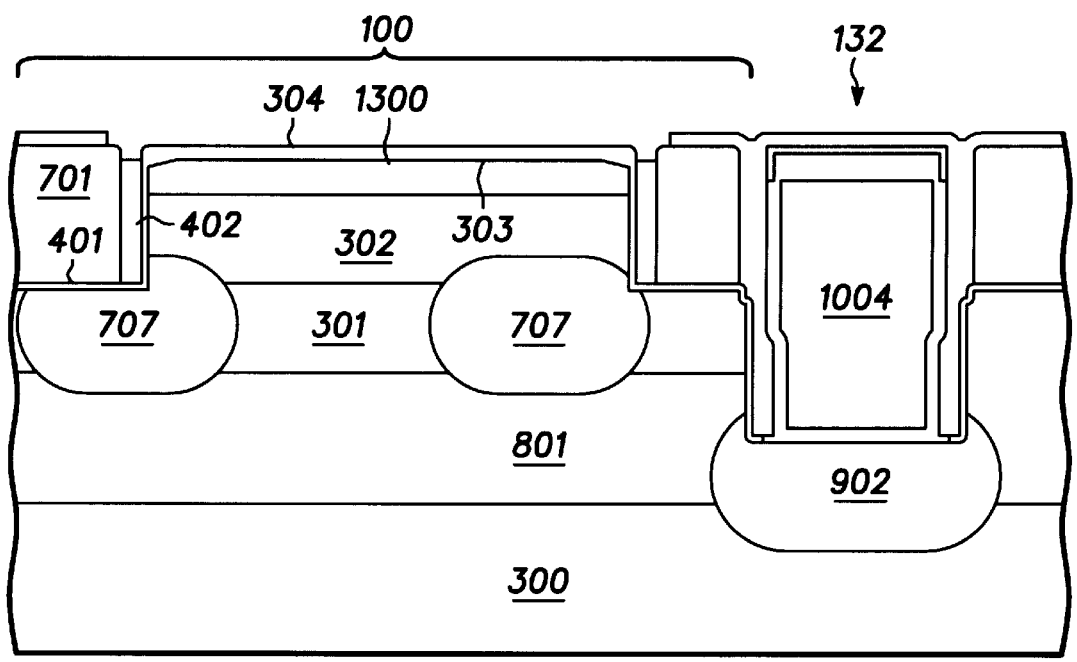

In FIG. 11, nitride layer 305 that overlies epitaxial layer 302 is removed to expose underlying oxide layer 304. Layer 304 serves as an etch stop during the etching of nitride layer 305. Then, surface 303 of epitaxial layer 302 is oxidized to increase the thickness of oxide layer 304. As an example, oxide layer 304 can be thermally grown to a total thickness of approximately 50–100 nanometers over epitaxial layer 302. Next, oxide layer 304 is used as an implant screen during the formation of lightly doped drain region 1300 in epitaxial layer 302. Region 1300 defines the active area for transistor 100, has the same conductivity type as epitaxial layer 302, and is also referred to as a drain extension region. The process of implanting region 1300 does not simultaneously form a lightly doped source region.

Figure 12:
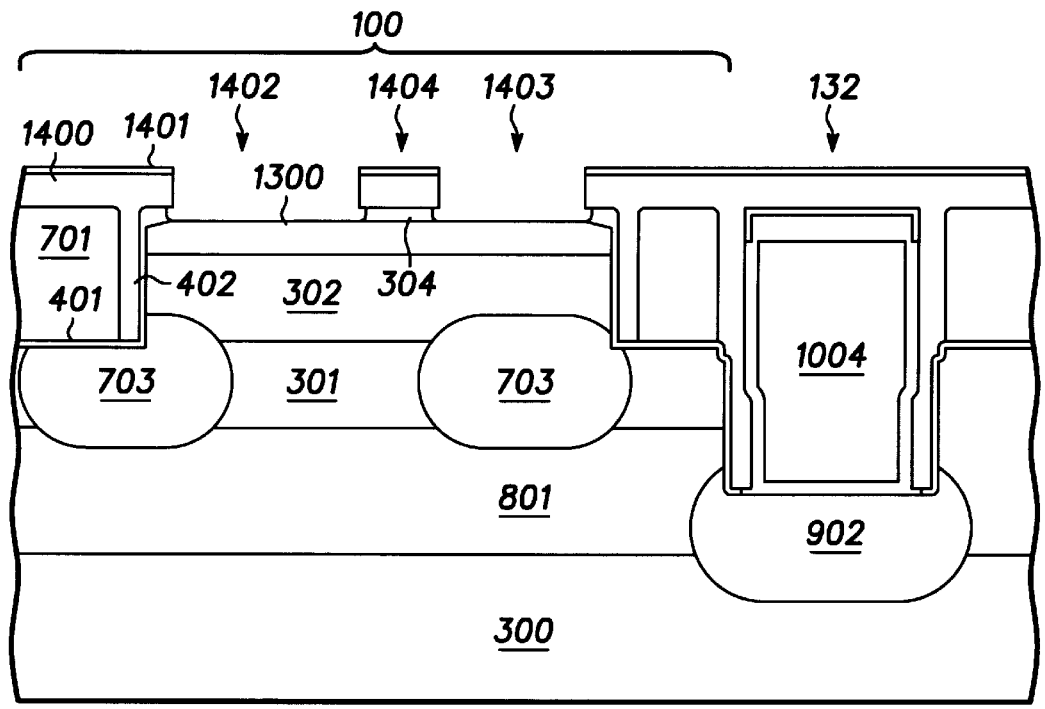

In FIG. 12, a nitride layer 1400 and a semiconductor layer 1401 are sequentially formed over oxide layer 304. As an example, nitride layer 1400 can have a thickness of approximately 150–250 nanometers, and semiconductor layer 1401 can have a thickness of approximately 10–20 nanometers and can be comprised of polysilicon. Holes 1402 and 1403 are formed through layers 1401, 1400, and 304 to be located over region 1300 and to expose portions of layer 302. First portions of holes 1402 and 1403 can be formed by using conventional etchants, such as RIE etchants, and a photoresist etch mask with underlying oxide layer 304 serving as an etch stop. The subsequently exposed portions of oxide layer 304 can be selectively removed by using wet etchants. Underlying epitaxial layer 302 serves as an etch stop during the patterning of oxide layer 304, but epitaxial layer 302 is preferably not significantly damaged by the etching of oxide layer 304. Holes 1402 and 1403 are separated from each other by central portions of layers 304 and 1400. These central portions of layers 304 and 1400 form a pedestal or dielectric structure 1404 that overlies a central portion of doped region 1300. The central portion of layer 1400 overlies the central portion of layer 304. Structure 1404 has a first side facing towards or defining an edge of hole 1402, and structure 1404 also has a second side opposite the first side and facing towards or defining an edge of hole 1403.

Figure 13:
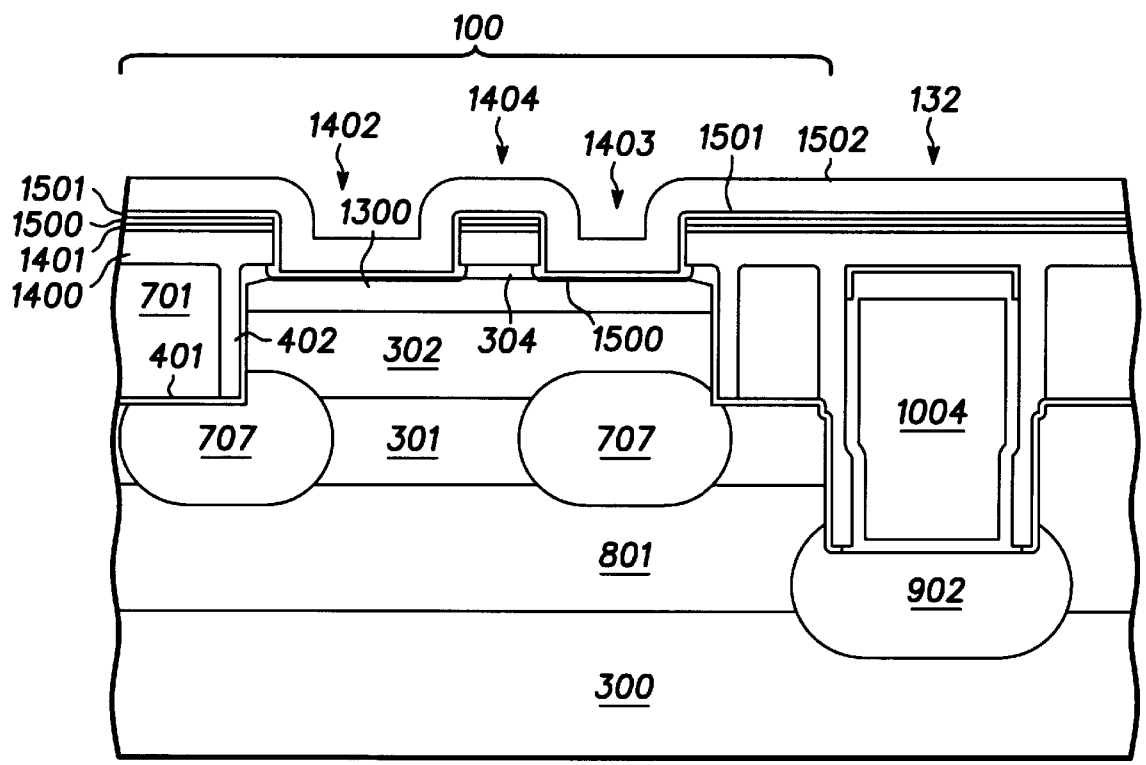

Continuing with FIG. 13, semiconductor layer 1401 and the exposed portions of epitaxial layer 302 are oxidized to form an oxide layer 1500 at the bottom of holes 1402 and 1403 and over semiconductor layer 1401. As an example, layer 1500 can have a thickness of approximately 10–20 nanometers. Then, a semiconductor layer 1501 is deposited over oxide layer 1500, over dielectric structure 1404, and over the sidewalls of holes 1402 and 1403. As an example, layer 1501 can have a thickness of approximately 10–20 nanometers and can be comprised of polysilicon. Next, a nitride layer 1502 is formed over layer 1501, over dielectric structure 1404, and in holes 1402 and 1403 to an approximate thickness of, for example, 150–250 nanometers.

Figure 14:
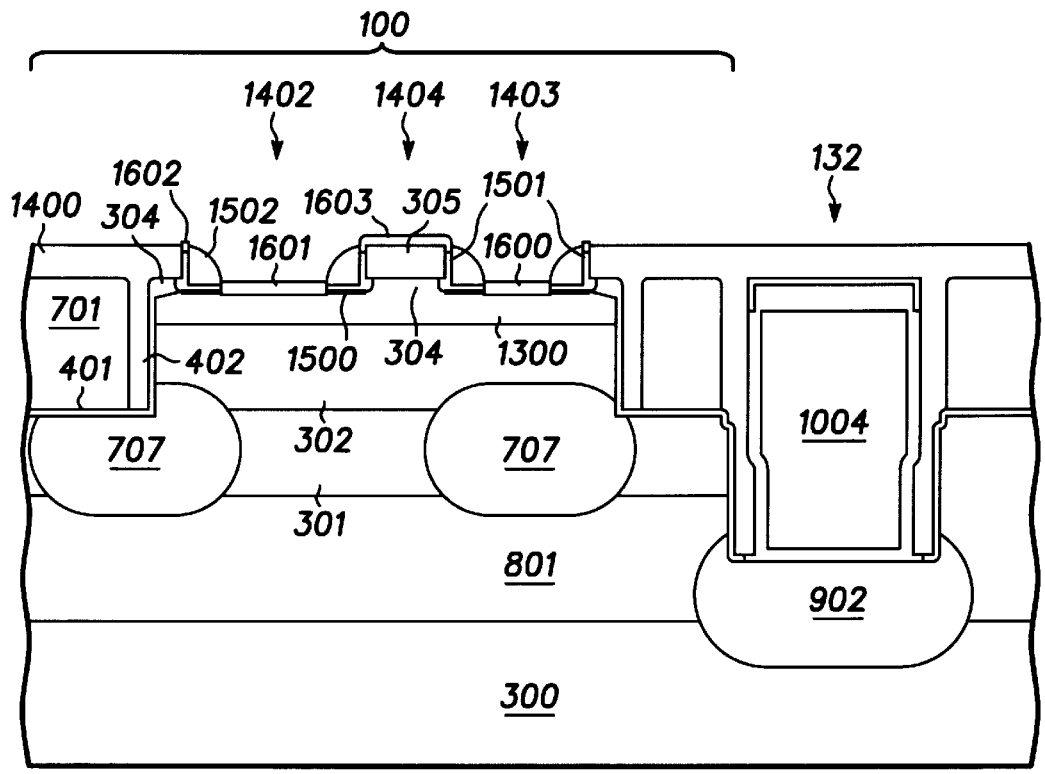

In FIG. 14, nitride layer 1502 is anisotropically etched to completely remove nitride layer 1502 from over layer 1400 and dielectric structure 1404 and to partially remove nitride layer 1502 from within holes 1402 and 1403. The anisotropic etching process uses nitride layer 1502 to form nitride spacers along the sidewalls of holes 1402 and 1403 and over perimeter portions of the bottom of holes 1402 and 1403. As depicted in FIG. 14, a pair of spacers is located in hole 1402 and over portions of epitaxial layer 302 and doped region 1300, and a different pair of spacers is located in hole 1403 and over different portions of epitaxial layer 302 and doped region 1300. Semiconductor layer 1501 (FIG. 13) serves as an etch stop for the etching of nitride layer 1502 and is removed during the formation of the nitride spacers. Portions of layer 1501 underneath the nitride spacers remain over epitaxial layer 302.

Then, oxide layer 1500 (FIG. 13) and semiconductor layer 1401 (FIG. 13) are also removed from over nitride layer 1400, but an etch mask (not shown) is used to protect or keep portions of layers 1500 and 1401 over structure 1404. The etch mask is also used to keep the oxide layer over epitaxial layer 302. The nitride spacers serve as an etch mask to protect the underlying portions of semiconductor layer 1501. Subsequently, the remaining exposed portions of semiconductor layer 1501 and the portions of epitaxial layer 302 located between the nitride spacers are thermally oxidized to selectively form or grow lens oxide layers 1600, 1601, 1602, 1603 at the bottom of holes 1402 and 1403. Oxide layer 1600, 1601, 1602, and 1603 each have a thickness of approximately 30–100 nanometers. Oxide layer 1500 (FIG. 13) over structure 1404 forms a portion of oxide layer 1603. The nitride spacers in holes 1402 and 1403 prevent the oxidation of the underlying portions of semiconductor layer 1501.

Next, the nitride spacers and nitride layer 1400 are selectively removed with semiconductor layer 1501, and oxide layers 304, 701, 1600, 1601, and 1603 serving as etch stops. Then, semiconductor layer 1501 is selectively removed with oxide layers 701, 1600, 1601, and 1603 serving as etch stops. The removal of layer 1501 will also remove oxide layer 1602.

Figure 15:
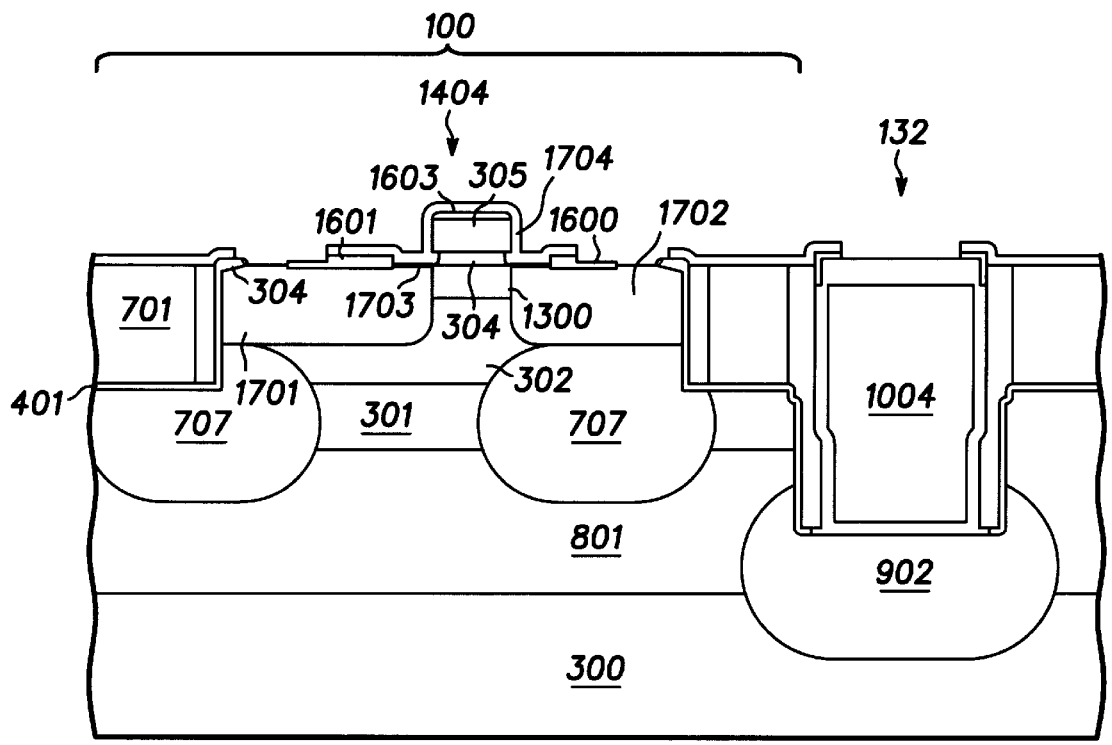

In FIG. 15, a lightly doped drain region 1701 having the second conductivity type and a channel region 1702 having the first conductivity type are formed in epitaxial layer 302. The inner edges of regions 1701 and 1702 are self-aligned to dielectric structure 1404, and the outer edges of regions 1701 and 1702 are defined by different implant masks (not shown) for each of regions 1701 and 1702. As an example, three separate implantations with three different implant energies can be used to form each of regions 1701 and 1702. The dopant ions used to form regions 1701 and 1702 are implanted through oxide layers 1600 and 1601 and through the adjacent thin portions of oxide layer 304. The formation of light doped drain region 1701 does not simultaneously form a light doped source region in epitaxial layer 302 so that transistor 100 maintains its asymmetric configuration.

Subsequently, the thin portions of oxide layer 304 that are adjacent to oxide layers 1600 and 1601 are removed to expose the underlying portions of epitaxial layer 302. Epitaxial layer 302 serves as an etch stop during this etching process, which also slightly thins oxide layers 1600 and 1601. Next, the exposed portions of epitaxial layer 302 are oxidized to form a gate oxide layer 1703 having a thickness of approximately 2–10 nanometers. This thermal oxidation process increases the thickness of oxide layers 1600, 1601 and 1603 and also anneals the doped regions within epitaxial layer 302. Layer 1703 overlies lightly doped drain region 1701 and channel region 1702.

Then, a semiconductor layer 1704 of approximately 50–100 nanometers in thickness is formed or deposited over oxide layers 1600, 1601, and 1703 and over dielectric structure 1404. As an example, layer 1704 can be comprised of amorphous or polycrystalline silicon. Semiconductor layer 1704 is processed, patterned, or etched as depicted in FIG. 15 using an etch mask (not shown). The exposed portions of gate oxide layer 1703 are subsequently removed to expose the underlying portions of epitaxial layer 302. Drain and source terminals or electrodes are subsequently connected to epitaxial layer 302 at the locations where gate oxide layer 1703 is removed.

Figure 16:
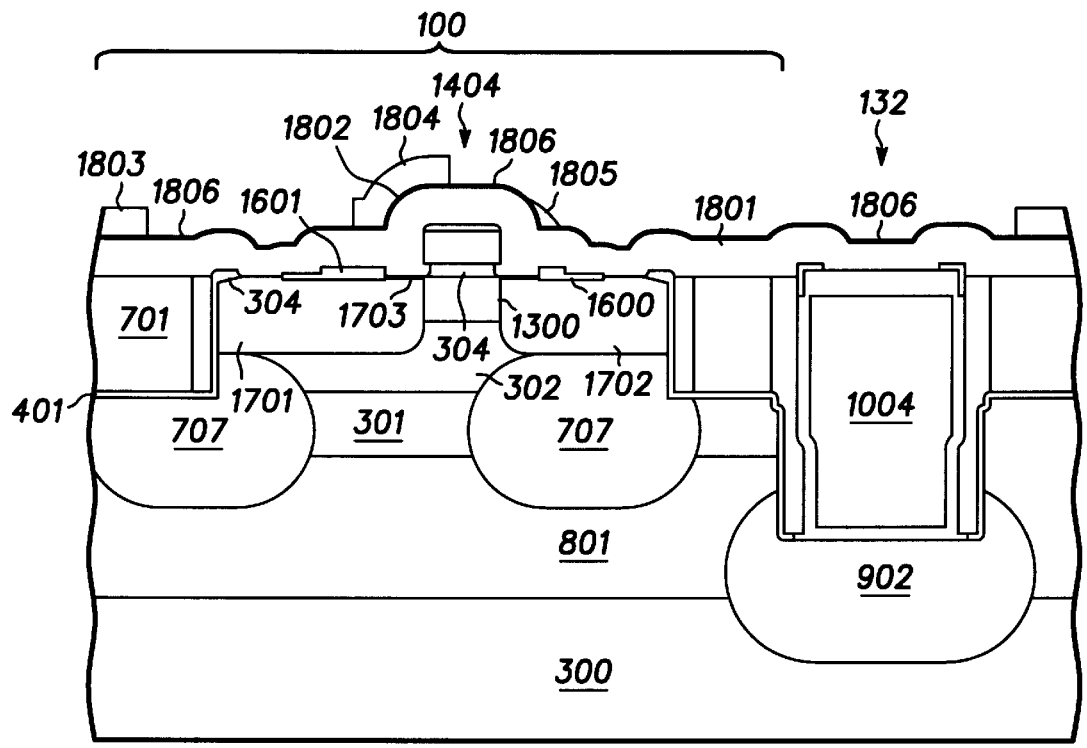

Continuing with FIG. 16, a semiconductor layer 1801 is formed to approximately 80–200 nanometers. Semiconductor layer 1801 is deposited over layer 1704 (FIG. 15) and over dielectric structure 1404. Layer 1801 is also deposited to be in contact with epitaxial layer 302 at locations where gate oxide layer 1703 was previously removed. As an example, layer 1801 can be comprised of amorphous or polycrystalline silicon. As described hereinafter, layer 1801, which includes underlying semiconductor layer 1704 (FIG. 15), is used to simultaneously form each of at least three electrodes for transistor 100.

The top surface of semiconductor layer 1801 is oxidized to form an oxide layer 1802 having a thickness of approximately 5–15 nanometers, and a nitride layer 1803 is formed over oxide layer 1802 to a thickness of approximately 100–200 nanometers. Nitride layer 1803 is anisotropically etched to create masked portion 1804 and spacer portion 1805. An etch mask is formed over lightly doped drain region 1701 to form portion 1804, but the etch mask is not formed over or is absent over channel region 1702 to form portion 1805. The topography underneath nitride layer 1803 and the anisotropic etching inherently form spacer portion 1805 out of nitride layer 1803 and self-align or automatically align the position and size of spacer portion 1805 relative to dielectric structure 1404. Next, the portions of semiconductor layer 1801 that are devoid of underlying nitride layer 1803 are oxidized further to form a lens oxide layer 1806 having a thickness of approximately 30–60 nanometers. The remaining portions of nitride layer 1803 serve as an oxidation mask.

Now, the remaining portions of nitride layer 1803 are removed, and the portions of semiconductor layer 1801 that are not covered by lens oxide layer 1806 are etched to pattern layer 1801. This etching process simultaneously forms adjacent, but non-contiguous, terminals or electrodes overlying the active area of transistor 100, as illustrated in FIG. 17. For example, drain electrode 1901, gate electrodes 1902 and 1903, and source electrode 1904 are formed out of semiconductor layer 1801. A portion of semiconductor layer 1801 that is etched away to separate gate electrode 1903 from source electrode 1904 is self-aligned to dielectric structure 1404 because of the self-aligned formation of spacer portion 1805 in FIG. 16. Accordingly, the edges of gate electrode 1903 and source electrode 1904 that are adjacent to each other are also self-aligned to dielectric structure 1404. Oxide layer 1806 serves as an etch mask while oxide layers 701, 1600, 1601, and 1603 are exposed and serve as etch stops during the etching of layer 1801.

Gate electrodes 1902 and 1903 are in a side-by-side and non-overlying relationship with each other and are also located between source and drain electrodes 1904 and 1901. In particular, electrodes 1902 and 1903 are separated from each other by dielectric structure 1404 and are located at opposite sides of and are contiguous with the opposite sides of structure 1404. Electrode 1903 overlies a portion of dielectric structure 1404 while electrode 1902 is absent over structure 1404. Electrodes 1902 and 1903 physically contact different portions of gate oxide layer 1703 and do not overlap each other. Electrode 1903 overlies channel region 1702 and lightly doped drain region 1300, but is preferably absent over lightly doped drain region 1701. On the other hand, electrode 1902 overlies lightly doped drain region 1701 and lightly doped drain region 1300, but is preferably absent over channel region 1702. As described earlier, gate electrode 1902 remains electrically floating while gate electrode 1903 is electrically coupled to an interconnect layer to control the channel conduction for transistor 100. Electrode 1902 is not affected by electrode 1903 and does not affect the channel conduction of transistor 100.

Next, the sidewalls of electrodes 1901, 1902, 1903, and 1904 are oxidized to thermally grow an oxide layer 1910.

Then, source and drain regions 1916 and 1915, respectively, are simultaneously formed into epitaxial layer 302. Source region 1916 is implanted in between gate electrode 1903 and source electrode 1904, through oxide layer 1600, and into epitaxial layer 302. Similarly, drain region 1915 is implanted in between drain electrode 1901 and gate electrode 1902, through oxide layer 1601, and into epitaxial layer 302. Regions 1915 and 1916 are not formed in epitaxial layer 302 by implanting through electrodes 1901, 1902, 1903, or 1904. Therefore, regions 1915 and 1916 are self-aligned to electrodes 1901, 1902, and 1903.

Electrodes 1901, 1902, 1903, and 1904 are doped to the same conductivity type as regions 1915 and 1916 during the formation of regions 1915 and 1916. Preferably, an implant mask is used to block the dopant from portion 1905 so that source electrode 1904 is not electrically shorted to power distribution structure 132. The dopant in electrodes 1901 and 1904 can also diffuse into epitaxial layer 301 at areas where gate oxide 1703 was previously removed such that electrodes 1901 and 1904 physically contact epitaxial layer 301. This dopant diffusion contributes to the formation of source and drain regions 1916 and 1915.

Then, a nitride layer 1920 is deposited, and semiconductor component 130 is annealed using a rapid thermal anneal (RTA) process to reduce the amount of dopant diffusion within epitaxial layer 302. As an example, the anneal may last approximately 10–60 seconds at temperatures of approximately 900–1100 degrees Celsius. Preferably, the doped regions within epitaxial layer 301 are annealed for approximately 20 seconds at about 1050 degrees Celsius. Afterwards, nitride layer 1920 is anisotropically etched back, as depicted in FIG. 17. Next, electrodes 1901, 1902, 1903, and 1904 are converted from polysilicon to a silicide such as, for example, titanium silicide or cobalt silicide. Nitride layer 1920 prevents the bridging or accidental shorting together of adjacent electrodes during the silicide process. Subsequently, a dielectric layer (not shown) is deposited, and appropriate vias or openings are etched into the dielectric layer. Then, an interconnect layer (not shown) is formed over the dielectric layer and in the vias to provide proper electrical biasing to the electrodes of transistor 100.

Figure 18:
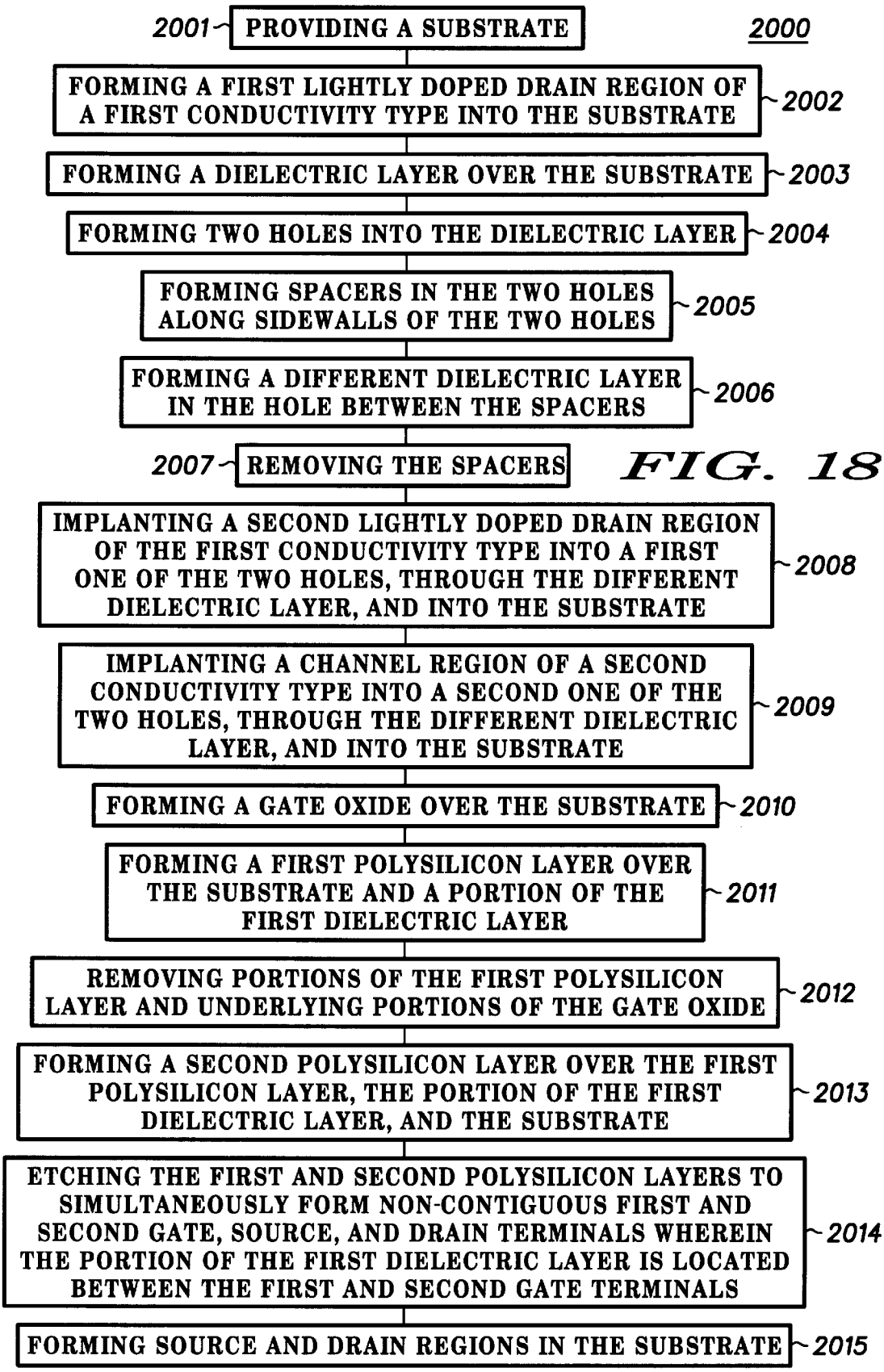
FIG. 18 outlines a method of manufacturing the second part of the portion of the semiconductor component, as illustrated in FIGS. 10–17, in accordance with the present invention.

FIG. 18 outlines a method 2000 of manufacturing a portion of semiconductor component 130, as illustrated in FIGS. 10–17. In particular, method 2000 focuses on the manufacturing of transistor 100. Method 2000 includes a step 2001 for providing a substrate and a step 2002 for forming a first lightly doped drain region of a first conductivity type into the substrate. Method 2000 continues with a step 2003 for forming a dielectric layer over the substrate and a step 2004 for forming two holes into the dielectric layer. Then, a step 2005 forms spacers in the two holes along sidewalls of the two holes. Next, a step 2006 forms a different dielectric layer in the hole between the spacers, and a step 2007 removes the spacers. Subsequently, a step 2008 implants a second lightly doped drain region of the first conductivity type into a first one of the two holes, through the different dielectric layer, and into the substrate, and then, a step 2009 implants a channel region of a second conductivity type into a second one of the two holes, through the different dielectric layer, and into the substrate. The sequence of steps 2008 and 2009 may be reversed. After forming a gate oxide over the substrate in a step 2010, a step 2011 forms a first polysilicon layer over a portion of the first dielectric layer and the substrate. Then, a step 2012 removes portions of the first polysilicon layer and underlying portions of the gate oxide. Next, a step 2013 forms a second polysilicon layer over the first polysilicon layer, the portion of the first dielectric layer, and the substrate, and then, a step 2014 etches the first and second polysilicon layers to simultaneously form non-contiguous first and second gate, source, and drain terminals wherein the portion of the first dielectric layer is located between the first and second gate terminals. Then, a step 2015 implants source and drain regions into the substrate while simultaneously doping the source, gate, and drain electrodes.

The process described in FIGS. 10–17 for manufacturing transistor 100 is compatible for simultaneously manufacturing ordinary CMOS devices, such as transistor 110 in FIG. 1, and is also compatible for simultaneously manufacturing bipolar transistors, such as transistor 120 in FIG. 2. For example, the implantation of lightly doped drain region 1701 of transistor 100 in FIG. 15 can also be used to simultaneously implant the p-channel region for transistor 110 in FIG. 1. Additionally, the formation of dielectric structure 1404 in FIG. 12 can also be used to simultaneously form a similar dielectric structure 1405 that is located underneath base electrode 121 of bipolar transistor 120 in FIG. 2. Furthermore, the multiple process steps used to form lens oxide layers 1600 and 1601 in FIG. 14 can be used to simultaneously form a lens oxide layer 1604 for bipolar transistor 120 in FIG. 2. Moreover, a base region 201 of NPN bipolar transistor 120 in FIG. 2 can be formed by alternative methods after forming gate oxide layer 1703 and semiconductor layer 1704 in FIG. 15. These alternative methods include forming base region 201 in epitaxial layer 301 by implanting through layers 1703 and 1704 before depositing semiconductor layer 1801 in FIG. 16 or forming base region 201 in epitaxial layer 301 by implanting only through oxide layer 1703 after patterning semiconductor layer 1704. Forming base region 201 after forming gate oxide layer 1703 permits better control of the size base region 201 because region 201 is not diffused during the high temperature oxidation process used to form gate oxide layer 1703.

As additional examples, the two step deposition process for semiconductor layer 1801 in FIGS. 15 and 16 can be used to simultaneously form gate electrodes 112, source electrode 111, and drain electrode 113 for transistor 110 in FIG. 1 and base electrode 121, emitter electrode 122, and collector electrode 123 for transistor 120 in FIG. 2. Furthermore, the technique used to form the adjacent edges of gate electrode 1903 and source electrode 1904 that are self-aligned to dielectric structure 1404 underneath gate electrode 1903 can also be used to simultaneously form adjacent edges of base electrode 121 and emitter electrode 122 that are self-aligned to dielectric structure 1405 underneath base electrode 121. Moreover, the formation of source and drain regions 1916 and 1915, respectively, in FIG. 17 by diffusion can also be used to simultaneously form an emitter region 202 for bipolar transistor 120 in FIG. 2. The source and drain regions of transistor 110 in FIG. 1 and a base contact region 203 of transistor 120 in FIG. 1 have the opposite type conductivity type compared to that of source and drain regions 1916 and 1915 of transistor 100 and emitter region 202 of transistor 120. These oppositely doped regions can be simultaneously implanted into epitaxial layer 301 while using an implant mask after patterning and oxidizing semiconductor layer 1801 and either just before or just after the simultaneous implantation of regions 1915 and 1916 and emitter region 202.

Figure 19:
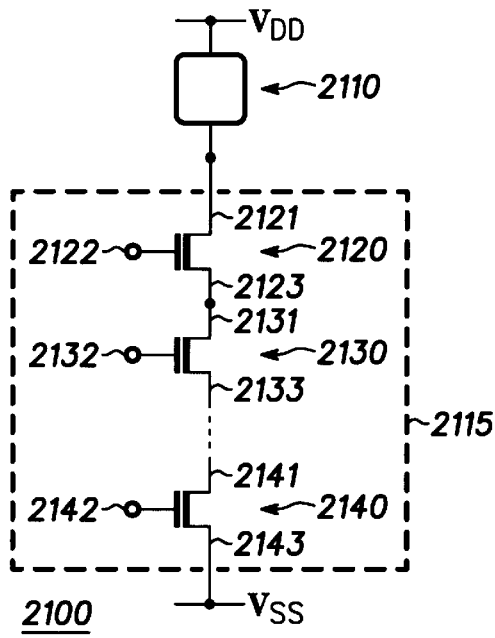
FIG. 19 illustrates an embodiment of a NAND gate in accordance with the present invention.

FIG. 19 illustrates a schematic of a CMOS NAND gate 2100, which can be a portion of component 130 in FIG. 1. The operation of NAND gate 2100 is similar to that of a standard CMOS NAND gate. However, NAND gate 2100 includes asymmetric transistors, which are preferably similar to transistor 100 in FIG. 17, but which can alternatively be similar to other asymmetric transistors known in the art. NAND gate 2100 includes a load 2110 coupled in series with a control circuit 2115.

Traditional CMOS logic gates use symmetrical transistors whose source and drain electrodes are interchangeable. Therefore, the relative positions of the source and drain electrodes in a symmetrical CMOS transistor is irrelevant. However, for asymmetric transistors, the source and drain electrodes are not interchangeable. Therefore, when building logic gates with asymmetric transistors, the positions of the source and drain electrodes for each of the asymmetric transistors in the logic gate is relevant in order to take full advantage of the improved characteristics of the asymmetric transistor.

Control circuit 2115 includes at least two asymmetric transistors of a first channel-type coupled in series with each other. In the embodiment illustrated in FIG. 19, circuit 2115 has asymmetric n-channel transistors 2120, 2130, and 2140 coupled together in series. It is understood that circuit 2115 can have more than three asymmetric n-channel transistors in series. In the preferred embodiment, circuit 2115 only uses asymmetric n-channel transistors.

Transistor 2120 has drain electrode 2121, gate electrode 2122, and source electrode 2123. Transistor 2130 has drain electrode 2131, gate electrode 2132, and source electrode 2133. Transistor 2140 has drain electrode 2141, gate electrode 2142, and source electrode 2143. Source electrode 2143 is coupled to a voltage potential identified in FIG. 19 as VSS. Drain electrode 2141 is coupled to source electrode 2133, and drain electrode 2131 is coupled to source electrode 2123.

Load 2110 has first and second terminals or electrodes. The first electrode of load 2110 is coupled to drain electrode 2121. The second electrode of load 2110 is coupled to a different voltage potential identified in FIG. 19 as VDD, which is a higher voltage potential than VSS.

Figure 20:
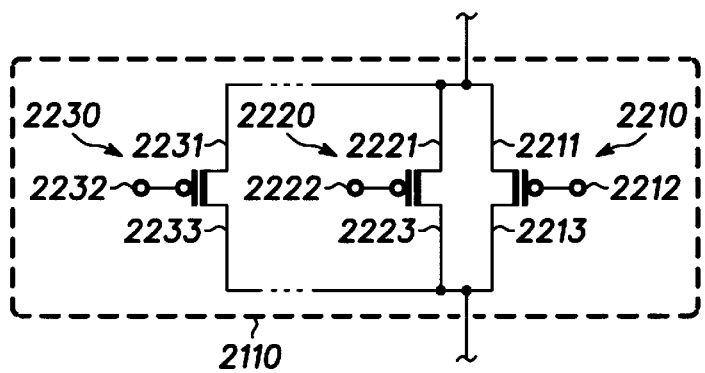
FIG. 20 illustrates an embodiment of a load in the NAND gate in accordance with the present invention.

FIG. 20 illustrates load 2110 in NAND gate 2100 (FIG. 19). Load 2110 includes at least one transistor of a second channel-type, which is different from the transistors of first channel-type in circuit 2115. In the embodiment illustrated in FIG. 20, load 2110 has p-channel transistors 2210, 2220, and 2230 coupled together in parallel. It is understood that load 2110 can have more than three p-channel transistors in parallel. Load 2110 can use symmetric p-channel transistors, but preferably uses only asymmetric p-channel transistors.

Transistor 2210 has source electrode 2211, gate electrode 2212, and drain electrode 2213. Transistor 2220 has source electrode 2221, gate electrode 2222, and drain electrode 2223. Transistor 2230 has source electrode 2231, gate electrode 2232, and drain electrode 2233. Source electrodes 2211, 2221, and 2231 are electrically coupled together and form the second electrode of load 2110 that is coupled to VDD (FIG. 19). Drain electrodes 2213, 2223, and 2233 are electrically coupled together and form the first terminal of load 2110 that is coupled to drain electrode 2121 (FIG. 19).

The gate electrodes of the p-channel transistors in load 2110 are logically coupled to the gate electrodes of the n-channel transistors in circuit 2115 (FIG. 19). For example, when the NAND gate is used to perform dynamic logic, load 2110 has a single p-channel transistor whose gate electrode is coupled to a clock signal, and a gate electrode of one of the asymmetric n-channel transistors in circuit 2115 is also coupled to a clock signal. The clock signals can be provided by two separate, but synchronous, clocks, or the clock signals can be provided by a single clock. As another example, when the NAND gate is used to perform static logic, the number of p-channel transistors coupled in parallel in load 2110 is the same as the number of asymmetrical n-channel transistors coupled in series in circuit 2115. In this embodiment, the gate electrode of each of the p-channel transistors is coupled to a gate electrode of a different one of the asymmetrical n-channel transistors.

The asymmetric configuration of transistors 2120, 2130, and 2140 in FIG. 19 and the possible asymmetric configuration of transistors 2210, 2220, and 2230 in FIG. 20 provides many advantages including higher drive capability, lower parasitic capacitances, and an improved body effect. The use of the asymmetric transistors in NAND gate 2100 (FIG. 19) provides many advantages including higher switching speed, increased fan out for a given transistor width, and the ability to build logic gates with higher fan in at a lower supply voltage.

Figure 21:
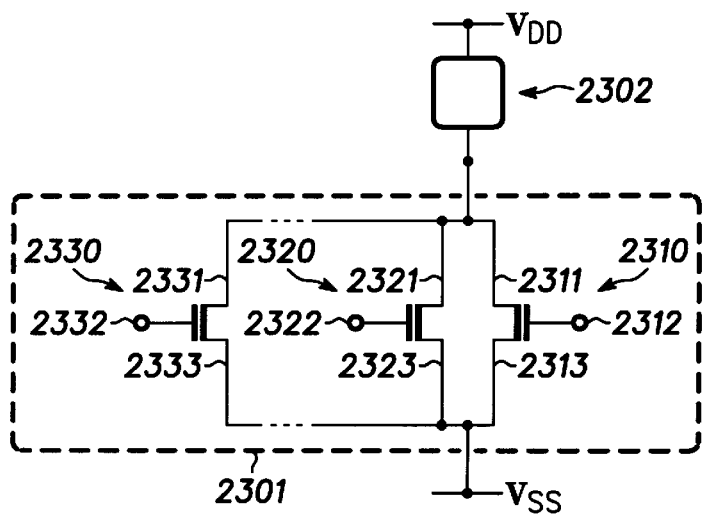
FIG. 21 illustrates an embodiment of a NOR gate in accordance with the present invention.

FIG. 21 illustrates a schematic of a CMOS NOR gate 2300, which can be a portion of component 130 in FIG. 1. The operation of NOR gate 2300 is similar to that of a standard CMOS NOR gate. However, NOR gate 2300 includes asymmetric transistors, which are preferably similar to transistor 100 in FIG. 17, but which can alternatively be similar to other asymmetric transistors known in the art. NOR gate 2300 includes a load 2302 coupled in series with a control circuit 2301.

Control circuit 2301 includes at least two asymmetric transistors of a first channel-type. In the embodiment illustrated in FIG. 21, circuit 2301 has asymmetric n-channel transistors 2310, 2320, and 2330 coupled together in parallel. It is understood that circuit 2301 can have more than three asymmetric n-channel transistors in parallel. Circuit 2301 preferably uses only asymmetric n-channel transistors.

Transistor 2310 has drain electrode 2311, gate electrode 2312, and source electrode 2313. Transistor 2320 has drain electrode 2321, gate electrode 2322, and source electrode 2323. Transistor 2330 has drain electrode 2331, gate electrode 2332, and source electrode 2333. Source electrodes 2313, 2323, and 2333 are electrically coupled together and are electrically coupled to a first voltage potential identified in FIG. 21 as VSS.

Load 2302 has first and second terminals or electrodes. The first electrode of load 2302 is electrically coupled to drain electrodes 2311, 2321, 2331. The second electrode of load 2302 is electrically coupled to a different voltage potential identified in FIG. 21 as VDD, which is a higher voltage potential than VSS.

Figure 22:
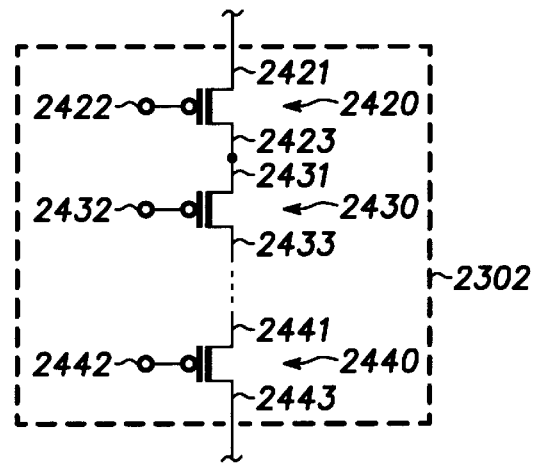
FIG. 22 illustrates an embodiment of a load in the NOR gate in accordance with the present invention.

FIG. 22 illustrates load 2302 in NOR gate 2300 (FIG. 21). Load 2302 includes at least one transistor of a second channel-type, which is different from the transistors of the first channel-type in circuit 2301. In the embodiment illustrated in FIG. 22, load 2302 has p-channel transistors 2420, 2430, and 2440 coupled together in series. It is understood that load 2302 can have more than three p-channel transistors in series. Load 2302 can use symmetric p-channel transistors, but preferably uses asymmetric p-channel transistors.

Transistor 2420 has source electrode 2421, gate electrode 2422, and drain electrode 2423. Transistor 2430 has source electrode 2431, gate electrode 2432, and drain electrode 2433. Transistor 2440 has source electrode 2441, gate electrode 2442, and drain electrode 2443. Source electrode 2421 is coupled to a voltage potential identified in FIG. 21 as VDD. Source electrode 2441 is coupled to drain electrode 2433, and source electrode 2431 is coupled to drain electrode 2423.

The gate electrodes of the p-channel transistors in load 2302 are logically coupled to the gate electrodes of the asymmetric n-channel transistors in circuit 2301 (FIG. 21). For example, when the NOR gate is used to perform dynamic logic, load 2302 has a single p-channel transistor whose gate electrode is coupled to a clock signal, and the gate electrodes of all of the asymmetric n-channel transistors in circuit 2301 are controlled by and also coupled to a clock signal. The clock signals can be provided by two separate, but synchronous, clocks, or the clock signals can be provided by a single clock. As another example, when the NOR gate is used to perform static logic, the number of p-channel transistors coupled in series in load 2302 is the same as the number of asymmetrical n-channel transistors coupled in parallel in circuit 2301. In this embodiment, the gate electrode of each of the p-channel transistors is coupled to a gate electrode of a different one of the asymmetrical n-channel transistors.

The asymmetric configuration of transistors 2310, 2320, and 2330 in FIG. 21 and the possible asymmetric configuration of transistors 2410, 2420, and 2430 in FIG. 22 of NOR gate 2300 provide the same advantages listed above for NAND gate 2100 in FIG. 20. Similar advantages can be obtained for other types of logic gates by using asymmetric transistors in a manner similar to that described in FIGS. 19–22.

Therefore, an improved semiconductor component and method of manufacture is provided to overcome the disadvantages of the prior art. The semiconductor component has transistors with high breakdown voltage, output impedance, and frequency response. The method of manufacturing the semiconductor component does not substantially increase the complexity or cost of a standard CMOS process and permits bipolar devices to be simultaneously manufactured with the CMOS devices to increase the functionality of the semiconductor component. The self-aligned lateral spacing between gate electrode 1903 and source electrode 1904 permits good control over the gate length of transistor 100 in FIG. 17. The self-aligned lateral spacing also permits a smaller space between electrodes 1903 and 1904 to enable the formation of a smaller transistor 100. The transistors disclosed herein enable the design of faster and more versatile circuits.

The transistors disclosed herein are similar to those disclosed in U.S. Pat. No. 5,661,048, which issued on Aug. 26, 1997 and which is assigned to the same assignee. However, the manufacturing method disclose herein is less complex and less expensive compared to that disclosed in U.S. Pat. No. 5,661,048.

While the invention has been particularly shown and described mainly with reference to preferred embodiments, it will be understood by those skilled in the art that changes in form and detail may be made without departing from the spirit and scope of the invention. For instance, the numerous details set forth herein such as, for example, layer thicknesses, material compositions, and doping levels are provided to facilitate the understanding of the present invention and are not provided to limit the scope of the invention. As another example, transistor 100 can have gate electrodes 1902 and 1902, as depicted in FIG. 17, and can have conventional, non-elevated silicide source and drain contacts. Accordingly, the disclosure of the present invention is not intended to be limiting. Instead, the disclosure of the present invention is intended to be illustrative of the scope of the invention, which is set forth in the following claims.

What is claimed is:

1. A semiconductor component comprising:

a semiconductor substrate;

a first lightly doped drain region in the semiconductor substrate;

a second lightly doped drain region in the semiconductor substrate and overlapping a first portion of the first lightly doped drain region;

a channel region in the semiconductor substrate and overlapping a second portion of the first lightly doped drain region, a third portion of the first lightly doped drain region separating the channel region from the second lightly doped drain region;

a source region in the semiconductor substrate and completely overlapped by the channel region;

a drain region in the semiconductor substrate and completely overlapped the second lightly doped drain region;

a dielectric structure overlying the semiconductor substrate and the third portion of the first lightly doped drain region;

a first gate electrode overlying a portion of the dielectric structure, a portion of the third portion of the first lightly doped drain region, and a portion of the channel region;

a second gate electrode overlying portions of the first and second lightly doped drain regions, the second gate electrode absent over the dielectric structure and absent over the channel region;

a drain electrode overlying the drain region; and a source electrode overlying the source region, the first and second gate electrodes located between the source and drain electrodes.

* * * * *